(12) United States Patent
Paek et al.

(10) Patent No.: US 7,359,579 B1
(45) Date of Patent: Apr. 15, 2008

(54) IMAGE SENSOR PACKAGE AND ITS MANUFACTURING METHOD

(75) Inventors: Jong Sik Paek, Seoul (KR); Ho Cheol Jang, Seoul (KR); Seong Min Seo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 734 days.

(21) Appl. No.: 10/962,221

(22) Filed: Oct. 8, 2004

(51) Int. Cl.
   *G06K 9/20* (2006.01)
(52) U.S. Cl. .................................................. 382/312
(58) Field of Classification Search .............. 382/312; 250/239, 208.1; 257/678, 734
   See application file for complete search history.

(56) References Cited

U.S. PATENT DOCUMENTS

| | | | |
|---|---|---|---|
| 3,880,528 A | 4/1975 | Petersen et al. | 356/225 |
| 4,055,761 A | 10/1977 | Shimomura | 250/239 |
| 4,491,865 A | 1/1985 | Danna et al. | 358/98 |
| 4,896,217 A | 1/1990 | Miyazawa et al. | 358/213.11 |
| 4,999,142 A | 3/1991 | Fukushima et al. | 264/1.7 |
| 5,023,442 A | 6/1991 | Taniguchi et al. | 250/208.1 |
| 5,068,713 A | 11/1991 | Toda | 357/72 |
| 5,122,861 A | 6/1992 | Tamura et al. | 357/74 |
| 5,220,198 A | 6/1993 | Tsuji | 257/731 |
| 5,274,456 A | 12/1993 | Izumi et al. | 358/209 |
| 5,365,101 A | 11/1994 | Tonai | 257/434 |
| 5,383,034 A | 1/1995 | Imamura et al. | 358/474 |
| 5,400,072 A | 3/1995 | Izumi et al. | 348/335 |
| 5,412,229 A | 5/1995 | Kuhara et al. | 257/183 |
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |
| 5,463,229 A | 10/1995 | Takase et al. | 257/59 |
| 5,489,995 A | 2/1996 | Iso et al. | 358/483 |
| 5,523,608 A | 6/1996 | Kitaoka et al. | 257/433 |
| 5,570,204 A | 10/1996 | Kumashiro | 358/471 |
| 5,581,094 A | 12/1996 | Hara et al. | 257/80 |
| 5,604,362 A | 2/1997 | Jedlicka et al. | 257/233 |
| 5,617,131 A | 4/1997 | Murano et al. | 347/233 |
| 5,655,189 A | 8/1997 | Murano | 399/220 |
| 5,672,902 A | 9/1997 | Hatanaka et al. | 257/431 |
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,821,532 A | 10/1998 | Beaman et al. | 250/239 |
| 5,825,560 A | 10/1998 | Ogura et al. | 359/822 |
| 5,861,654 A | 1/1999 | Johnson | 257/433 |
| 5,902,993 A | 5/1999 | Okushiba et al. | 250/208.1 |

(Continued)

FOREIGN PATENT DOCUMENTS

GB 1022329 7/1964

(Continued)

*Primary Examiner*—Phuoc Tran
(74) *Attorney, Agent, or Firm*—Gunnison, Mckay & Hodgson, L.L.P.; Serge J. Hodgson

(57) ABSTRACT

Disclosed are an image sensor package and a method for manufacturing the same. A sealing portion is formed between an image sensor die and a glass substrate to completely isolate the sensing portion of the image sensor die from external environment. Electrically conductive bumps are formed outside of the sealing portion to electrically connect the image sensor die to the glass substrate. The image sensor die can be sealed by a cap while the image sensor die is connected to the glass substrate via the electrically conductive bumps.

20 Claims, 13 Drawing Sheets

U.S. PATENT DOCUMENTS

| | | | |
|---|---|---|---|
| 5,932,875 A | 8/1999 | Chung et al. | 250/239 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,384,397 B1 | 5/2002 | Takiar et al. | 250/208.1 |
| 6,384,472 B1 | 5/2002 | Huang | 257/680 |
| 6,392,703 B1 | 5/2002 | Uchino et al. | 348/373 |
| 6,498,624 B1 | 12/2002 | Ogura et al. | 348/335 |
| 6,518,656 B1 | 2/2003 | Nakayama et al. | 257/680 |
| 6,627,864 B1 | 9/2003 | Glenn et al. | 250/208.1 |
| 6,627,872 B1 | 9/2003 | FuKamura et al. | 250/239 |
| 6,762,796 B1 | 7/2004 | Nakajoh et al. | 348/340 |
| 6,767,753 B2 | 7/2004 | Huang | 438/25 |
| 6,867,438 B1 | 3/2005 | Maruyama et al. | 257/184 |
| 7,141,782 B2 * | 11/2006 | Chen | 250/239 |
| 7,173,231 B2 * | 2/2007 | Chen | 250/214.1 |
| 2003/0137595 A1 | 7/2003 | Takachi | 348/340 |

FOREIGN PATENT DOCUMENTS

| | | |
|---|---|---|
| GB | 2 146 504 | 4/1985 |
| JP | 59-228755 | 12/1984 |
| JP | 62-224047 | 10/1987 |
| JP | 09-021938 | 1/1997 |
| JP | 09-232548 | 9/1997 |
| JP | 10-302587 | 11/1998 |
| WO | WO 93/22787 | 11/1993 |
| WO | WO 00/38103 | 6/2000 |
| WO | WO 03/019660 | 3/2003 |

* cited by examiner

IMAGE SENSOR PACKAGE AND ITS MANUFACTURING METHOD

BACKGROUND OF THE INVENTION

1. Field of the Invention

The present invention relates to an image sensor package and its manufacturing method.

2. Description of the Related Art

In general, image sensors are devices which sense the information regarding objects to be photographed and transform it into video signals. Such devices may be classified into camera tubes, such as vidicons and plumbicons, and solid image sensors, such as complementary metal oxide semiconductors (CMOSs) and charge coupled devices (CCDs). When an image sensor is manufactured as the solid image sensor, it is generally used as a type of sensor wherein a lens is coupled to a semiconductor package which contains a semiconductor die for image sensors therein.

Conventional image sensor packages are composed of a glass substrate having electrically conductive patterns formed thereon and an image sensor die coupled to the electrically conductive patterns of the glass substrate via electrically conductive bumps. Such image sensor packages have an underfill formed between the glass substrate and the image sensor die, in order to improve the coupling force between the glass substrate and the image sensor die and to protect the sensing portion which is formed on the image sensor die. Such an underfill is generally of a type which surrounds the electrically conductive bumps.

However, such conventional image sensor packages, which use an underfill having low viscosity, have a problem in that the underfill may flow to the sensing portion of the image sensor die and degrade the performance of the image sensor die. This, of course, decreases the overall production yield of the package.

In addition, since the underfill cannot completely interrupt moisture, a large amount of moisture may be distributed, under certain conditions, between the glass substrate and the sensing portion formed on the image sensor die. Such a large amount of moisture formed on the sensing portion, of course, degrades the sensing function of the image sensor package in a drastic manner.

For above underfill process, at least a predetermined distance must be secured between solder balls, which are connected to the glass substrate, and the electrically conductive bumps. This increases the overall size of the package. Such an increase of size of the package acts as a hindrance to the current trend of making electronic products in a compact size.

Furthermore, additional equipment is necessary for the underfill process. This increases the manufacturing cost and makes the manufacturing process more complicated. In particular, expensive underfill dispensing equipment increases the manufacturing cost of the package, and the additional underfill process, which must be performed after the glass substrate and the image sensor die are coupled to each other, makes the process more complicated.

BRIEF SUMMARY OF THE INVENTION

Disclosed are an image sensor package and a method for manufacturing the same. A sealing portion is formed between an image sensor die and a glass substrate to completely isolate the sensing portion of the image sensor die from external environment. Electrically conductive bumps are formed outside of the sealing portion to electrically connect the image sensor die to the glass substrate. The image sensor die can be sealed by a cap while the image sensor die is connected to the glass substrate via the electrically conductive bumps. Even in this case, the sensing portion of the image sensor die is still completely isolated from external environment. Accordingly, no external alien substance or moisture can penetrate into the sensing portion of the image sensor die, and the image sensing capability is improved accordingly. The inter-coupling force between the image sensor die and the glass substrate is additionally improved.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION

Figure 1A:
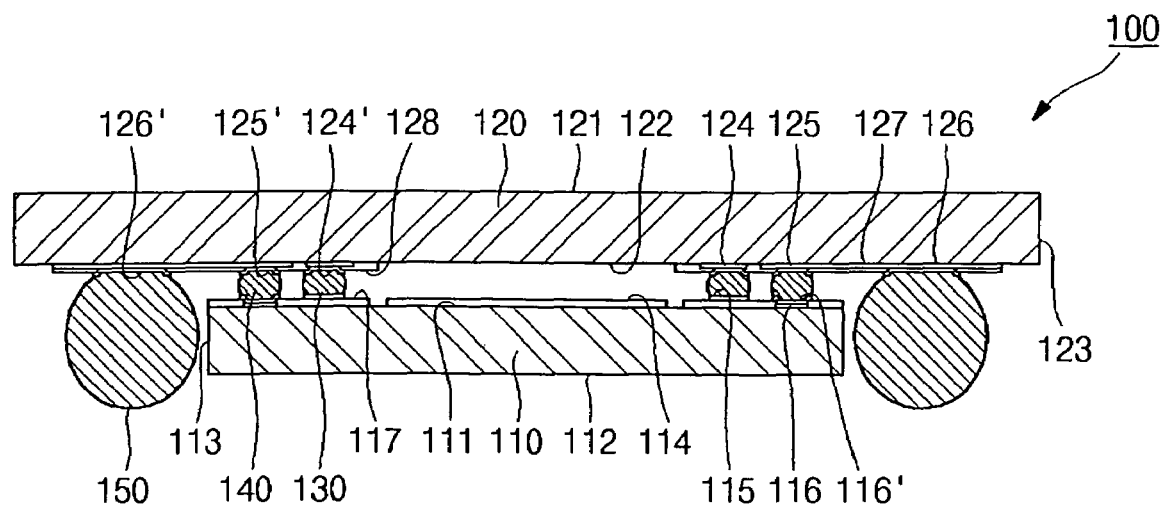
FIG. 1A is a sectional view showing an image sensor package according to an embodiment of the prevent invention.
Figure 1B:
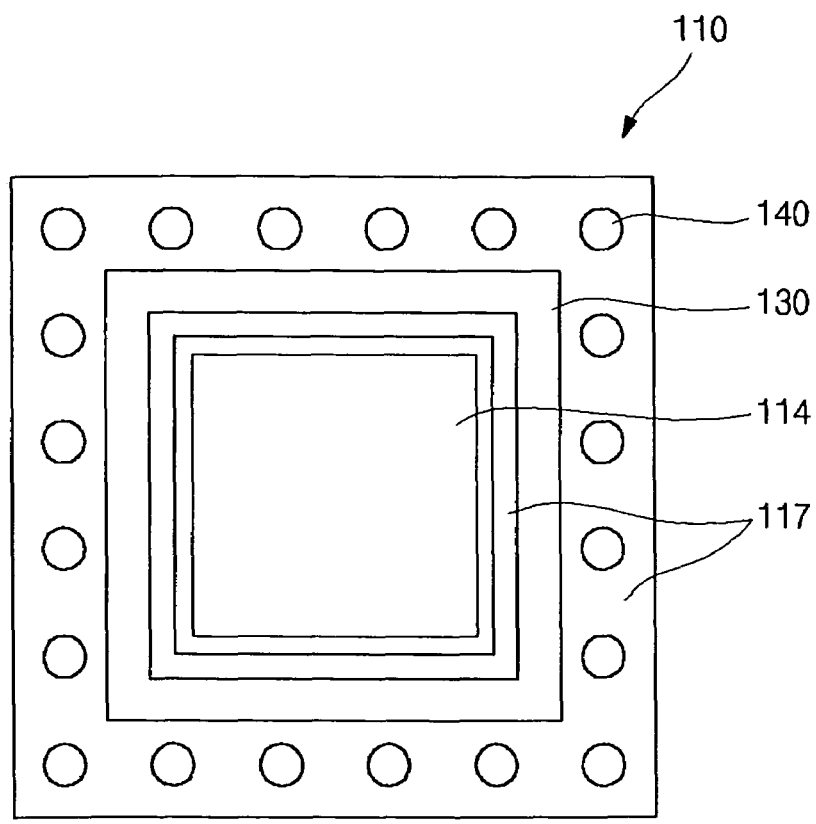
FIG. 1B is a top view showing an image sensor die.
Figure 1C:
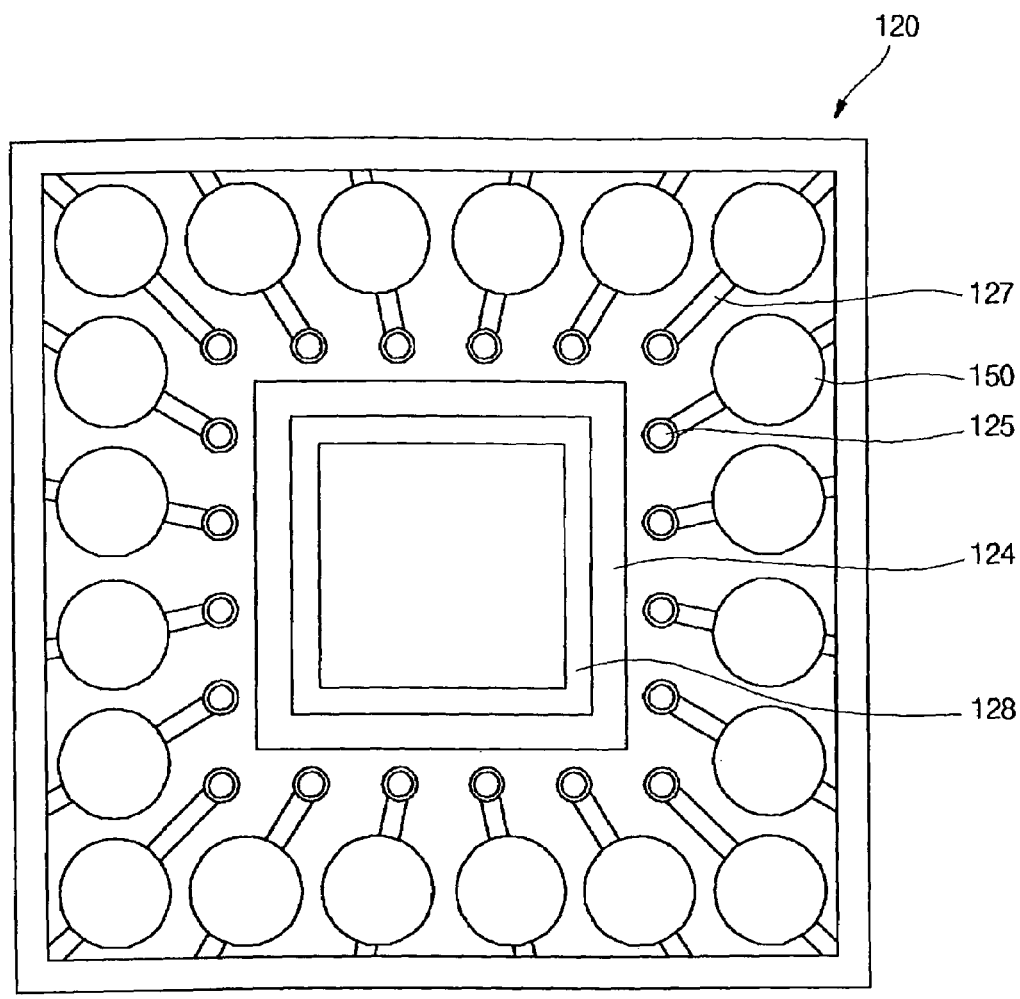
FIG. 1C is a bottom view showing a glass substrate.

Referring to FIG. 1A, a sectional view of an image sensor package according to an embodiment of the present invention is shown, referring to FIG. 1B, a top view of an image sensor die is shown, and referring to FIG. 1C, a bottom view of a glass substrate is shown.

As shown, an image sensor package 100 according to the present invention includes an image sensor die 110 for sensing external images and converting them into electric signals, a glass substrate 120 for electrically connecting the image sensor die 110 to an external apparatus and stably retaining the image sensor die 110 on the external apparatus, a sealing portion 130 connected between the image sensor die 110 and the glass substrate 120 to prevent any external alien substance from penetrating into the sensing region of the image sensor die 110, a number of electrically conductive bumps 140 for electrically connecting the image sensor die 110 to the glass substrate 120, and a number of solder balls 150 for electrically connecting the glass substrate 120 to the external apparatus and stably supporting the glass substrate 120 on the external apparatus.

The image sensor die 110 has an approximately planar first surface 111 and an approximately planar second surface 112, which is opposite to the first surface 111. The image sensor die 110 has a number of third surfaces 113 positioned on the lateral ends of the first and second surfaces 111 and 112. The image sensor die 110 has a sensing portion 114 formed approximately in the center of the first surface 111 for sensing external images and converting them into predetermined electric signals. A first sealing pad 115 is formed on the first surface 111, which is the outer peripheral edge of the sensing portion 114, in the shape of an approximately square ring when viewed from above. The first sealing pad 115 has a number of first bonding pads 116 formed on the outer peripheral edge thereof. A protective layer 117 of a predetermined thickness is formed in a region of the first surface 111 of the image sensor die 110, except for the sensing portion 114 and the first bonding pads 116, and the first sealing pad 115 may be formed on the protective layer 117. The first sealing pad 115 may be formed of copper, under bumped metal (UBM), or an equivalent thereof for good connection with the sealing portion 130, but the material is not limited herein. The first bonding pads 116 may also have UBM 116' formed thereon for good connection with the electrically conductive bumps 140.

The glass substrate 120 has an approximately planar first surface 121 and an approximately planar second surface 122, which is opposite to the first surface 121. The glass substrate 120 has a number of third surfaces 123 formed on the lateral ends of the first and second surfaces 121 and 122. The glass substrate 120 has a second sealing pad 124, which has an approximately square ring shape when viewed from above, formed in a location corresponding to that of the first sealing pad 115 in a corresponding shape. A number of second bonding pads 125 are formed on the outer peripheral edge of the second sealing pad 124 in locations corresponding to those of the first bonding pads 116 in a corresponding shape. The second bonding pads 125 have a number of ball pads 126 formed on the outer peripheral edges thereof so that solder balls 150 can be fused thereon. Since the ball pads 126 are positioned on the outer peripheral edge of the image sensor die 110, the solder balls 150 are prevented from contacting the third surfaces 113 of the image sensor die 110 at a later time. The second sealing pad 124 is electrically separated from the second bonding pads 125 and the ball pads 126, while the second bonding pads 125 and the ball pads 126 are electrically connected to each other by the electrically conductive patterns 127. All of the second sealing pad 124, the second bonding pads 125, the ball pads 126, and the electrically conductive patterns 127 may, of course, be formed of copper or its equivalent, but the material is not limited herein. The second surface 122 has a protective layer 128 of a predetermined thickness formed thereon, except for the second sealing pad 124, the second bonding pads 125, and the ball pads 126, so that the electrically conductive patterns 127 can be protected from external environment. Of course, no protective layer 128 is formed in a region corresponding to the sensing portion 114 of the image sensor die 110 so that external light can be easily transmitted to the sensing portion 114. The second sealing pad 124, the second bonding pads 125, and the ball pads 126 may have UBM 124', 125', and 126' formed thereon for good connection with the sealing portion 130, the electrically conductive bumps 140, and the solder balls 150, respectively, at a later time.

The sealing portion 130 connects the first sealing pad 115 of the image sensor die 110 and the second sealing pad 124 of the glass substrate 120 to each other. The sealing portion 130 may be formed of solder or its equivalent, but the material is not limited herein. The sealing portion 130 completely seals and isolates the sensing portion 114 of the image sensor die 110 from the exterior, so that no external alien substance can penetrate into the sensing portion 114. The sealing portion 130 connects the image sensor die 110 to the glass substrate 120 in a firmer manner, so that the image sensor die 110 and the glass substrate 120 cannot be separated from each other. The sealing portion 130 has excellent resistance to moisture and can completely prevent any moisture from penetrating into the sensing portion 114 of the image sensor die 110. The sealing portion 130 makes it unnecessary to form an underfill on electrically conductive bumps 140 (described below). Since no underfill is formed, it is possible to avoid any contamination of the sensing portion 114 by the underfill.

The electrically conductive bumps 140 electrically connect the first bonding pads 116 of the image sensor die 110 and the second bonding pads 125 of the glass substrate 120 to each other. The electrically conductive bumps 140 make it possible to convert external images, which are sensed by the sensing portion 114, into electric signals and to transmit them toward the electrically conductive patterns 127 of the glass substrate 120. Of course, electric signals from an external apparatus can also be transmitted to the image sensor die 110 via the electrically conductive bumps 140. The electrically conductive bumps 140 may be formed of solder or its equivalent, but the material is not limited herein.

The solder balls 150 are fused on the ball pads 126 of the glass substrate 120. The solder balls 150 are positioned outside of the third surfaces 113 of the image sensor die 110. The solder balls 150 do not contact the third surfaces 113 of the image sensor die 110. The height of the solder balls 150 is larger than that of the image sensor die 110. Accordingly, the solder balls 150 can be connected to an external apparatus in a stable manner without any hindrance from the image sensor die 110.

Figure 2:
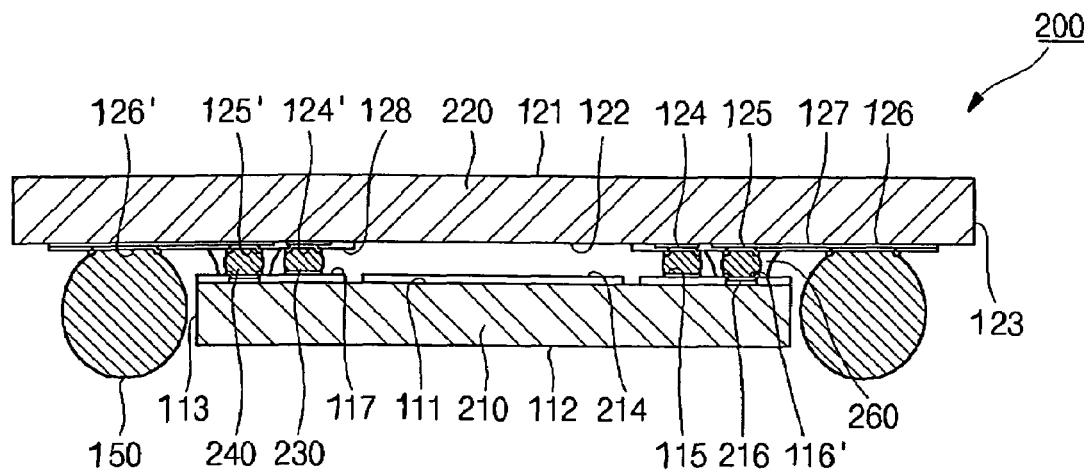
FIG. 2 is a sectional view showing an image sensor package according to another embodiment of the present invention.

Referring to FIG. 2, a sectional view of an image sensor package according to another embodiment of the present invention is shown.

As shown, the image sensor package 200 has a structure which is substantially the same as that of the above-mentioned image sensor package 100. Accordingly, the differences will mainly be described.

The electrically conductive bumps 240, which electrically connect the second bonding pads 225 of the image sensor die 210 and the first bonding pads 216 of the glass substrate 220 to each other, may be surrounded by an underfill 260 having high viscosity. Of course, the underfill 260 has high viscosity during a formation process, but is hardened by a curing process.

The image sensor die 210 and the glass substrate 220 can be mechanically coupled to each other more firmly by the underfill 260. Therefore, the coupling force between the image sensor die 210 and the glass substrate 220 is increased drastically. Despite the use of the underfill 260, of course, the sensing portion 214 is not contaminated by the underfill 260. This is because the sensing portion 214 has been completely sealed and isolated from the exterior by the sealing portion 230. In other words, although the underfill 260 may flow toward the sealing portion 230 during the formation of the underfill 260, the underfill 260 cannot reach the sensing portion 214 through the sealing portion 230.

Figure 3A:
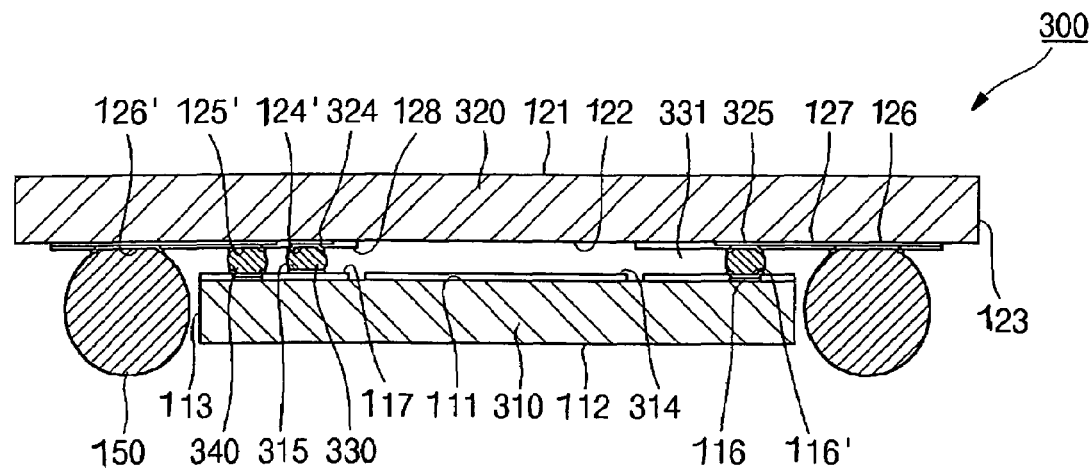
FIG. 3A is a sectional view showing an image sensor package according to another embodiment of the present invention.
Figure 3B:
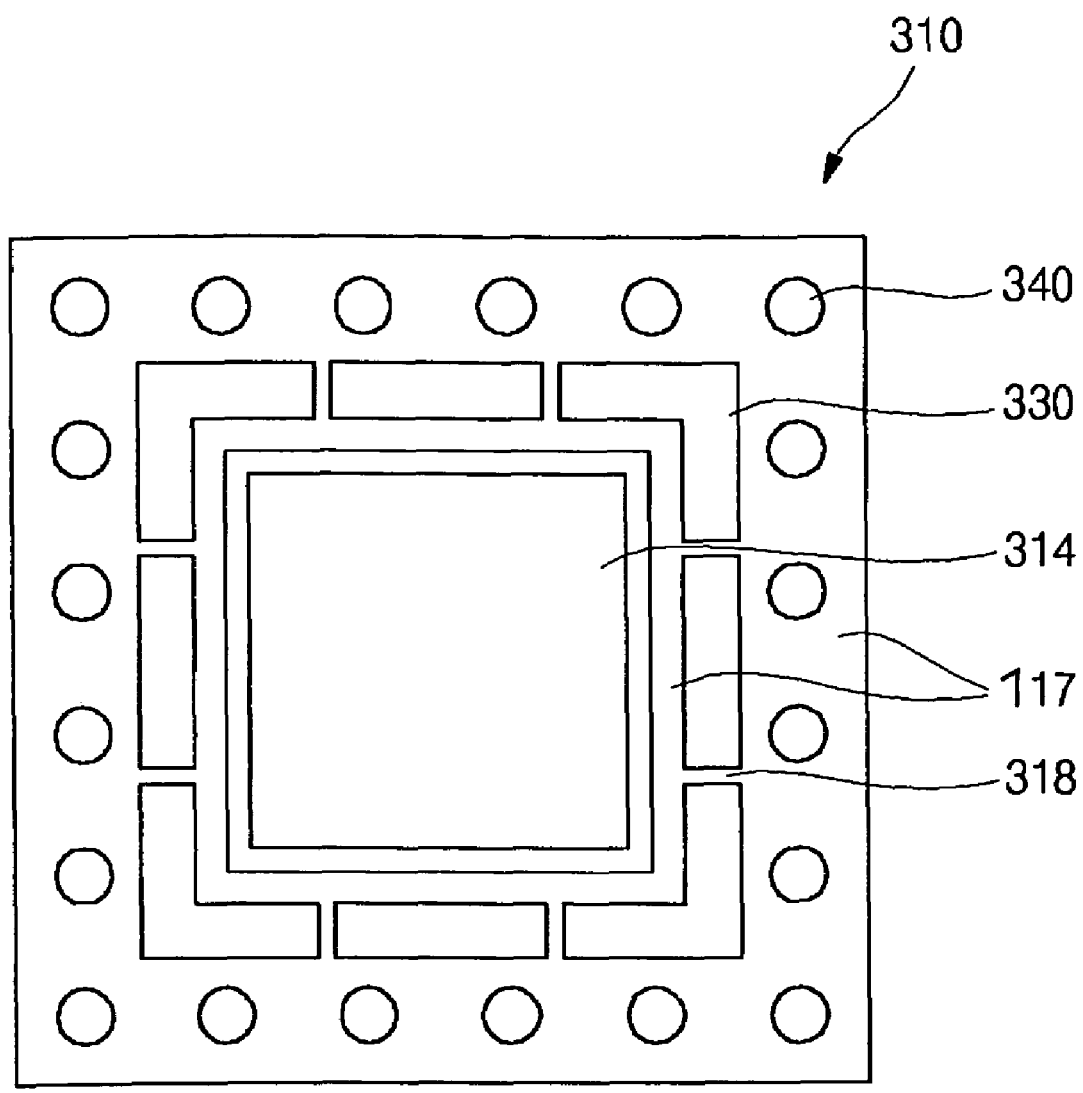
FIG. 3B is a top view showing an image sensor die.
Figure 3C:
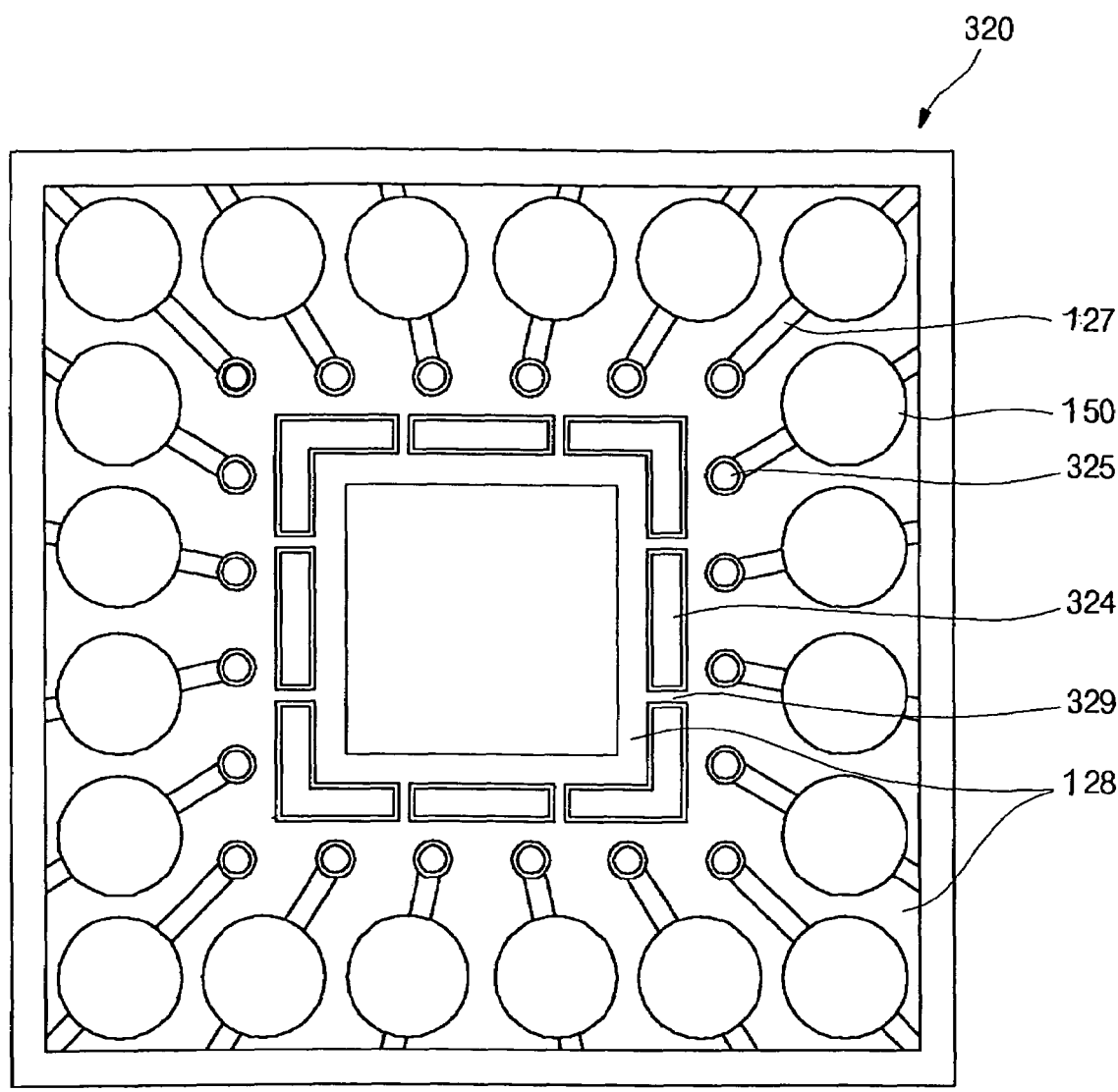
FIG. 3C is a bottom view showing a glass substrate.

Referring to FIG. 3A, a sectional view of an image sensor package 300 according to another embodiment of the present invention, referring to FIG. 3B, a top view of an image sensor die 310 is shown, and referring to FIG. 3C, a bottom view of a glass substrate 320 is shown.

As shown, the image sensor package 300 also has a structure which is substantially the same as that of the above-mentioned image sensor package 100. Accordingly, the differences will mainly be described.

The first sealing pad 315 of the image sensor die 310 and the second sealing pad 324 of the glass substrate 320, which are in good connection to each other via the sealing portion 330, have at least one air vent incision 318 and 329 formed thereon. Particularly, the first sealing pad 315 and the second sealing pad 324 have the shape of an at least partially opened square ring, not a closed square ring, when viewed from above. Of course, the air vent incisions 318 and 329 are formed on the first and second sealing pads 315 and 324 in locations corresponding to each other. The sealing portion 330, which connects the first sealing pad 315 to the second sealing pad 324, is not formed on the air vent incisions 318 and 329. Therefore, the sealing portion 330 naturally has an air vent 331 formed in a location corresponding to those of the air vent incisions 318 and 329. The air vent 331 plays the role of protecting the sensing portion 314 during a process through which heat is provided (for example, a process for connecting the electrically conductive bumps 340 to the second bonding pads 325 of the glass substrate 320), of a process for manufacturing the image sensor package. Without the air vent 331, the sensing portion 314 would be completely isolated from the exterior and the internal pressure would increase during the process through which heat is provided. The surface of the sensing portion 314, when subject to such high pressure, would be easily fractured. However, the existence of the air vent 331 prevents the sensing portion 314 from being fractured, because the internal pressure does not increase even during the process through which heat is provided.

Figure 4:
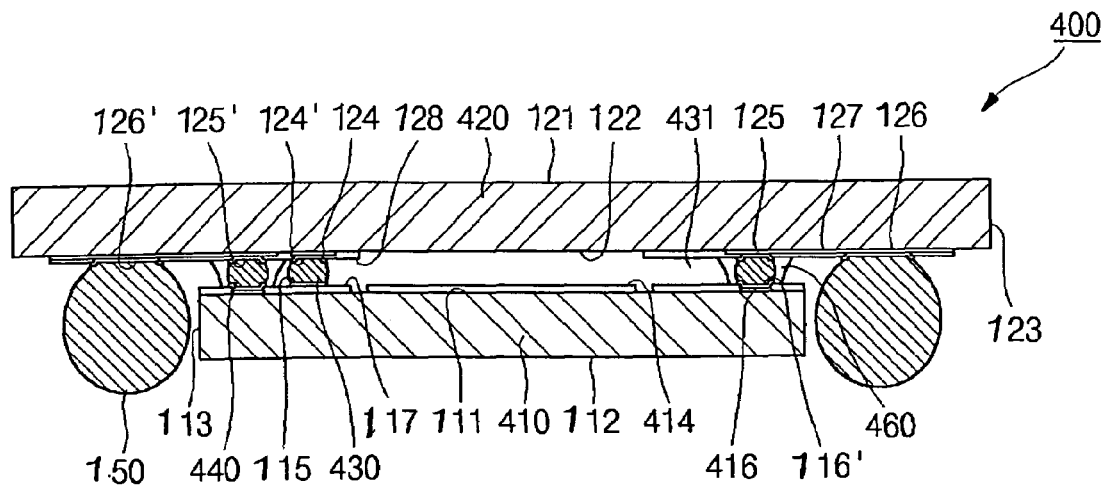
FIG. 4 is a sectional view showing an image sensor package according to another embodiment of the present invention.

Referring to FIG. 4, a sectional view of an image sensor package according to another embodiment of the present invention is shown.

As shown, the image sensor package 400 has a structure which is substantially the same as that of the above-mentioned image sensor package 300. Accordingly, the differences will mainly be described.

The electrically conductive bumps 440, which electrically connect the first bonding pads 416 of the image sensor die 410 and the first bonding pads 416 of the glass substrate 420 to each other, may be surrounded by an underfill 460 having high viscosity. Of course, the underfill 460 has high viscosity during a formation process, but is hardened by a curing process.

The image sensor die 410 and the glass substrate 420 can be mechanically coupled to each other more firmly by the underfill 460. Therefore, the coupling force between the image sensor die 410 and the glass substrate 420 is increased drastically. Despite the use of the underfill 460, of course, the sensing portion 414 is barely contaminated by the underfill 460. This is because the sensing portion 414 has been almost isolated from the exterior by the sealing portion 430. Although a small amount of the underfill 460 may flow to the sensing portion 414 via the air vent 431 of the sealing portion 430, the possibility is very low.

Figure 5:
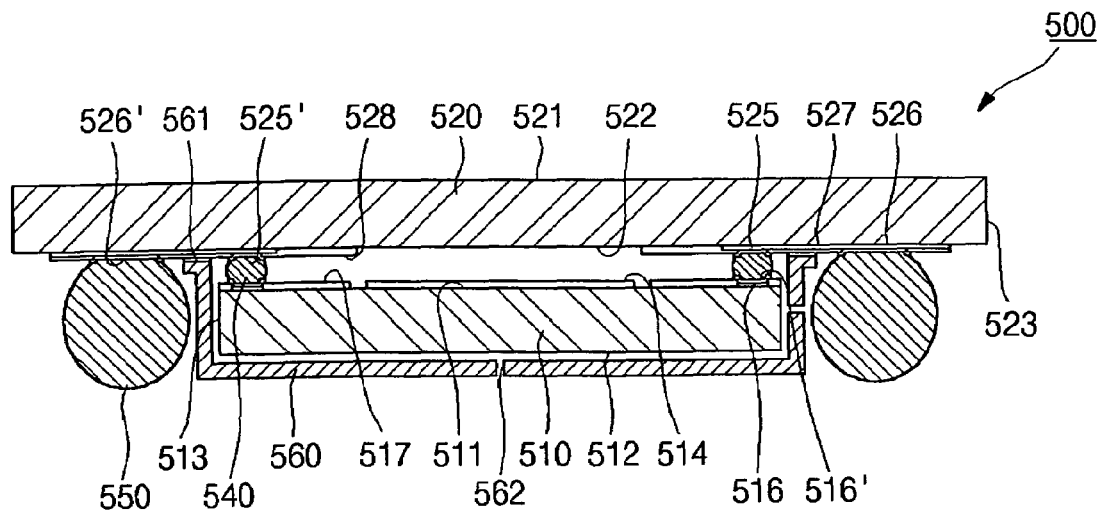
FIG. 5 is a sectional view showing an image sensor package according to another embodiment of the present invention.

Referring to FIG. 5, a sectional view of an image sensor package according to another embodiment of the present invention is shown.

As shown, the image sensor package 500 according to the present invention includes an image sensor die 510 for sensing external images and converting them into electric signals, a glass substrate 520 for electrically connecting the image sensor die 510 to an external apparatus and stably retaining the image sensor die 510 on the external apparatus, a number of electrically conductive bumps 540 for electrically connecting the image sensor die 510 to the glass substrate 520, a number of solder balls 550 for electrically connecting the glass substrate 520 to the external apparatus and stably retaining the glass substrate 520 on the external apparatus, and a cap 560 glued on the glass substrate 520, while covering the image sensor die 510, so that any external alien substance cannot penetrate into the sensing region of the image sensor die 510.

The image sensor die 510 has an approximately planar first surface 511 and an approximately planar second surface 512, which is opposite to the first surface 511. The image sensor die 510 has a number of third surfaces 513 formed on the lateral ends of the first and second surfaces 511 and 512. The image sensor die 510 has a sensing portion 514 formed approximately in the center of the first surface 511 for sensing external images and converting them into predetermined electric signals. The sensing portion 514 has a number of first bonding pads 516 formed on the outer peripheral edge thereof. A protective layer 517 of a predetermined thickness is formed on a region of the first surface 511 of the image sensor die 510, except for the sensing portion 514 and the first bonding pads 516. The first bonding pads 516 may have UBM 516' formed thereon for good connection with the electrically conductive bumps 540.

The glass substrate 520 has an approximately planar first surface 521 and an approximately planar second surface 522, which is opposite to the first surface 521. The glass substrate 520 has a number of third surfaces 523 formed on the lateral ends of the first and second surfaces 521 and 522. The glass substrate 520 has a number of second bonding pads 525 formed in locations corresponding to those of the first bonding pads 516 in a corresponding shape. The second bonding pads 525 has a number of ball pads 526 formed on the outer peripheral edges thereof so that solder balls 550 can be fused thereon. The ball pads 526 are positioned on the outer peripheral edge of the image sensor die 510, so that the solder balls 550 do not contact the image sensor die 510 at a later time. The second bonding pads 525 and the ball pads 526 are electrically connected to each other by electrically conductive patterns 527. The second bonding pads 525, the ball pads 526, and the electrically conductive patterns 527 may be formed of copper or its equivalent, but the material is not limited herein. The second surface 522 has a protective layer 528 of a predetermine thickness formed thereon, except for the second bonding pads 525 and the ball pads 526, so that the electrically conductive patterns 527 can be protected from external environment. Of course, no protective layer 528 is formed in a region corresponding to the sensing portion 514 of the image sensor die 510 so that external light can be easily transmitted to the sensing portion 514. The second bonding pads 525 and the ball pads 526 may have UBM 525', 526', and 516' formed thereon for good connection with the electrically conductive bumps 540 and the solder balls 550, respectively, at a later time.

The electrically conductive bumps 540 electrically connect the first bonding pads 516 of the image sensor die 510 and the second bonding pads 525 of the glass substrate 520 to each other. The electrically conductive bumps 540 makes it possible to convert external images, which are sensed by the sensing portion 514, into electric signals and to transmit them toward the electrically conductive patterns 527 of the glass substrate 520. Of course, electric signals from an external apparatus may also be transmitted to the image sensor die 510 via the electrically conductive bumps 540. The electrically conductive bumps 540 may be formed of solder or its equivalent, but the material is not limited herein.

The solder balls 550 are fused on the ball pads 526 of the glass substrate 520. The solder balls 550 are positioned outside of the third surfaces 513 of the image sensor die 510. The solder balls 550 do not contact the cap 560. The height of the solder balls 550 is larger than that of the cap 560. Accordingly, the solder balls 550 can be connected to an external apparatus in a stable manner without any hindrance from the cap 560.

The cap 560 is glued on the glass substrate 520, which is the outer peripheral edge of the image sensor die 510, with an adhesive 561 interposed between them and covers the image sensor die 510 as a whole. Therefore, the sensing portion 514 of the image sensor die 510 is completely isolated from the exterior by the cap 560. The cap 560 also prevents any external alien substance or moisture from moving toward the sensing portion 514. The cap 560 may be formed of a conductor, a non-conductor, or an equivalent thereof, but the material is not limited herein.

The cap 560 may have at least one air vent 562 formed thereon. The location of the air vent 562 is not limited. For example, the air vent 562 may be formed on the lateral portion of the cap 560, on the bottom surface thereof, or on both of them. The air vent 562 plays the role of protecting the sensing portion 514 during a process through which heat is provided, of a process for manufacturing the image sensor package. Without the air vent 562, the sensing portion 514 would be completely isolated from the exterior and the internal pressure would increase during the process through which heat is provided. The surface of the sensing portion 514, when subject to such high pressure, would be easily fractured. However, the existence of the air vent 562 prevents the sensing portion 514 from being fractured, because the internal pressure does not increase even during the process through which heat is provided.

Figure 6A:
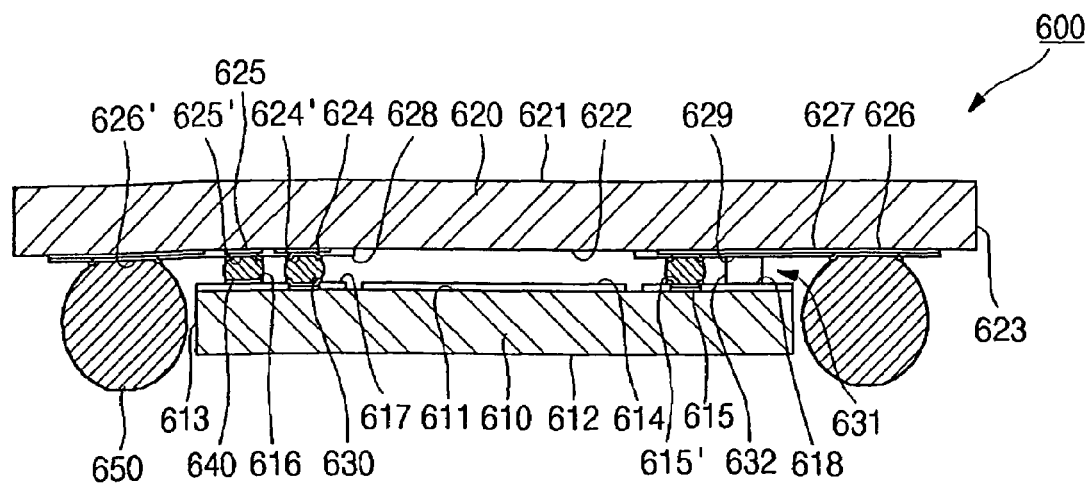
FIG. 6A is a sectional view showing an image sensor package according to another embodiment of the present invention.
Figure 6B:
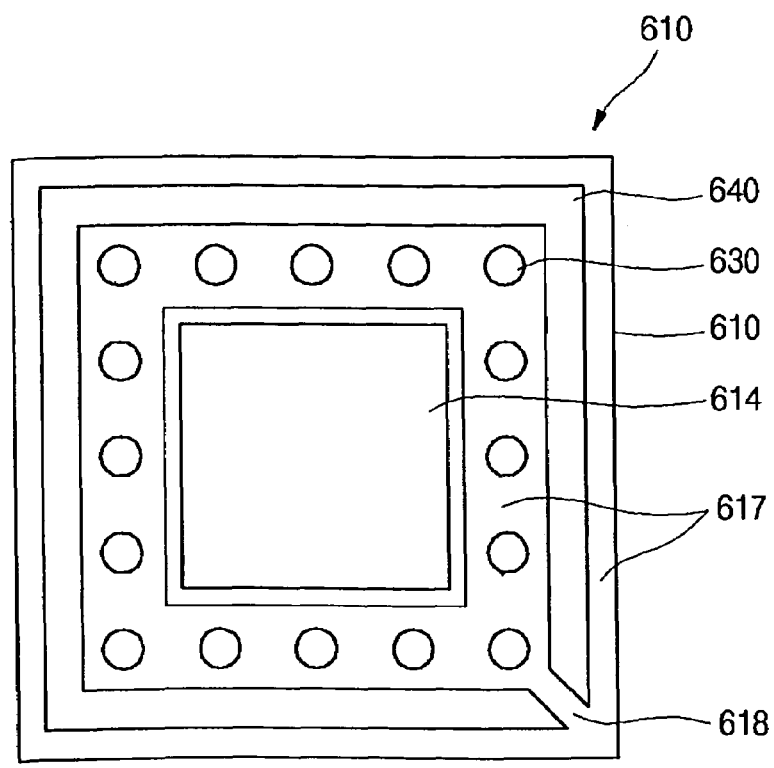
FIG. 6B is a top view showing an image sensor die.

Referring to FIG. 6A, a sectional view of an image sensor package according to another embodiment of the present invention is shown, and referring to FIG. 6B, a top view of an image sensor die is shown.

As shown, the image sensor package 600 according to another embodiment of the present invention includes an image sensor die 610 for sensing external images and converting them into electric signals, a glass substrate 620 for electrically connecting the image sensor die 610 to an external apparatus and stably retaining the image sensor die 610 on the external apparatus, a number of electrically conductive bumps 630 for electrically connecting the image sensor die 610 to the glass substrate 620, a sealing portion 640 connected between the image sensor die 610 and the glass substrate 620 so that no external alien substance can penetrate into the sensing region of the image sensor die 610, and a number of solder balls 650 for electrically connecting the glass substrate 620 to the external apparatus and stably retaining the glass substrate 620 on the external apparatus.

The image sensor die 610 has an approximately planar first surface 611 and an approximately planar second surface 612, which is opposite to the first surface 611. The image sensor die 610 has a number of third surfaces 613 formed on the lateral ends of the first and second surfaces 611 and 612. The image sensor die 610 has a sensing portion 614 formed approximately in the center of the first surface 611 for sensing external images and converting them into predetermined electric signals. A number of first bonding pads 615 are formed on the first surface 611, which is the outer peripheral edge of the sensing portion 614. The first bonding pads 615 have a first sealing pad 616 formed on the outer peripheral edge thereof in the shape of an approximately square ring when viewed from above. The first sealing pad 616 has at least one air vent incision 618 formed in a predetermined region. For example, the air vent incision 618 may be formed on an approximately square corner of the first sealing pad 616, but the location does not limit the present invention. A protective layer 617 of a predetermined thickness is formed in a region of the first surface 611 of the image sensor die 610, except for the sensing portion 614 and the first bonding pads 615, and the first sealing pad 616 and the air vent incision 618 may be formed on the protective layer 617. The first sealing pad 616 may be formed of copper, under bumped metal (UBM), or an equivalent thereof for good connection with the sealing portion 640, but the material is not limited herein. The first bonding pads 615 may also have UBM 615' formed thereon for good connection with the electrically conductive bumps 630.

The glass substrate 620 has an approximately planar first surface 621 and an approximately planar second surface 622, which is opposite to the first surface 621. The glass substrate 620 has a number of third surfaces 623 formed on the lateral ends of the first and second surfaces 621 and 622. The glass substrate 620 has a number of second bonding pads 624 formed in locations corresponding to those of the first bonding pads 615 in a corresponding shape. The second bonding pads 624 has a second sealing pad 625, which has an approximately square ring shape when viewed from above, formed on the outer peripheral edge thereof in a location corresponding to that of the first sealing pad 616 in a corresponding shape. The second sealing pad 625 has at least one air vent incision 629 formed in a predetermined region. For example, the air vent incision 629 may be formed on an approximately square corner of the second sealing pad 625, but the location does not limit the present invention. The second sealing pad 625 has a number of ball pads 626 formed on the outer peripheral edge thereof so that solder balls 650 can be fused thereon. The ball pads 626 are located on the outer peripheral edge of the image sensor die 610, so that the solder balls 650 do not contact the third surfaces 613 of the image sensor die 610 at a later time. The second sealing pad 625 is electrically separated from the second bonding pads 624 and the ball pads 626, while the second bonding pads 624 and the ball pads 626 are electrically connected to each other via electrically conductive patterns 627. Of course, all of the second bonding pads 624, the second sealing pad 625, the ball pads 626, and the electrically conductive patterns 627 may be formed of copper or its equivalent, but the material is not limited herein. The second surface 622 has a protective layer 628 of a predetermined thickness formed thereon, except for the second bonding pads 624, the second sealing pad 625, and the ball pads 626, so that the electrically conductive patterns 627 can be protected from external environment. Of course, no protective layer 628 is formed in a region corresponding to the sensing portion 614 of the image sensor die 610, so that external light can be easily transmitted to the sensing portion 614. Meanwhile, the second bonding pads 624, the second sealing pad 625, and the ball pads 626 may have UBM 624', 625', and 626' formed thereon for good connection with the electrically conductive bumps 630, the sealing portion 640, and the solder balls 650, respectively, at a later time.

The electrically conductive bumps 630 electrically connect the first bonding pads 615 of the image sensor die 610 and the second bonding pads 624 of the glass substrate 620 to each other. Accordingly, the electrically conductive bumps 630 makes it possible to convert external images, which are sensed by the sensing portion 614, into electric signals and to transmit them toward the electrically conductive patterns 627 of the glass substrate 620. Of course, electric signals from an external apparatus can also be transmitted to the image sensor die 610 via the electrically conductive bumps 630. The electrically conductive bumps 630 may be formed of solder or its equivalent, but the material is not limited herein.

The sealing portion 640 connects the first sealing pad 616 of the image sensor die 610 and the second sealing pad 625 of the glass substrate 620 to each other. The sealing portion 640 may be formed of solder or its equivalent, but the material is not limited herein. Meanwhile, no conductor is formed on the air vent incision 618 of the image sensor die 610 and on the air vent incision 629 of the glass substrate 620, and therefore an air vent 631 is naturally formed on the sealing portion 640. The air vent 631 plays the role of protecting the sensing portion 614 during a process through which heat is provided (for example, a process for connecting the electrically conductive bumps 630 to the second bonding pads 624 of the glass substrate 620), of a process for manufacturing the image sensor package. Without the air vent 631, the sensing portion 614 would be completely isolated from the exterior and the internal pressure would increase during the process through which heat is provided. The surface of the sensing portion 614, when subject to such high pressure, would be easily fractured. However, the existence of the air vent 631 prevents the sensing portion 614 from being fractured, because the internal pressure does not increase even during the process through which heat is provided.

Meanwhile, the air vent 631 is filled with a resin 632 after the process through which heat is provided, so that the sensing portion 614 and the electrically conductive bumps 630 are completely isolated from the exterior. The resin may be silicone or its equivalent, but the material is not limited herein. By means of the sealing portion 640 and the resin 632, the electrically conductive bumps 630 and the sensing portion 614 of the image sensor die 610 are completely sealed and isolated from the exterior, so that no external alien substance can penetrate into the sensing portion 614 or into the electrically conductive bumps 630. The sealing portion 640 connects the image sensor die 610 to the glass substrate 620 in a firmer manner, so that the image sensor die 610 and the glass substrate 620 cannot be separated from each other. The sealing portion 640 also has excellent resistance to moisture and can completely prevent any moisture from penetrating into the sensing portion 614 of the image sensor die 610. The sealing portion 640 makes it unnecessary to form an underfill on the electrically conductive bumps 630. Since no underfill is formed, it is possible to avoid any contamination of the sensing portion 614 by the underfill.

The solder balls 650 are fused on the ball pads 626 of the glass substrate 620. The solder balls 650 are positioned outside of the third surfaces 613 of the image sensor die 610. The solder balls 650 do not contact the third surfaces 613 of the image sensor die 610. The height of the solder balls 650 is larger than that of the image sensor die 610. Accordingly, the solder balls 650 can be connected to an external apparatus in a stable manner without any hindrance from the image sensor die 610.

Referring to FIG. 7A to FIG. 7E, a method for manufacturing an image sensor package according to an embodiment of the present invention is shown in series.

As shown, a method for manufacturing an image sensor package according to the present invention includes: preparing an image sensor die 110 including a first sealing pad 115 and a number of first bonding pads 116; forming a sealing portion 130 on the first sealing pad 115 and electrically conductive bumps 140 on the first bonding pads 116, respectively; preparing a glass substrate 120 including a second sealing pad 124, a number of second bonding pads 125, and a number of ball pads 126; fusing solder balls 150 on respective ball pads 126; and connecting the image sensor die 110 to the glass substrate 120.

Figure 7A:
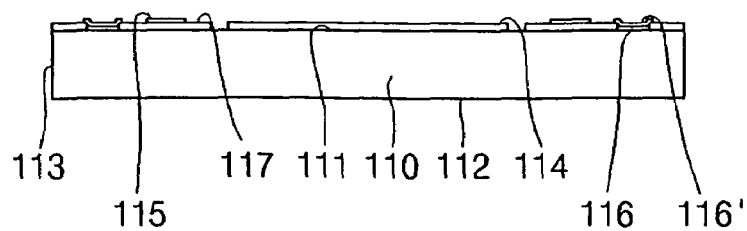
FIG. 7A to FIG. 7E show a method for manufacturing an image sensor package according to an embodiment of the present invention.

As shown in FIG. 7A, in the preparing an image sensor die 110, an image sensor die 110, which includes a first sealing pad 115 of an approximately square ring shape when viewed from above and first bonding pads 116 formed on the outer peripheral edge of the first sealing pad 115, is formed. The image sensor die 110 has an approximately planar first surface 111 and an approximately planar second surface 112, which is opposite to the first surface 111, and the first sealing pad 115 and the first bonding pads 116 are formed on the first surface 111. The first surface 111 has a sensing portion 114 formed approximately in the center thereof for sensing external images and converting them into electric signals. The image sensor die 110 has third surfaces 113 formed on the lateral ends of the first and second surfaces 111 and 112. The first sealing pad 115 may be formed of copper, UBM, or an equivalent thereof, and the first bonding pads 116 may additionally have UBM 116' or its equivalent formed on the upper surface thereof, but the material does not limit the present invention. The image sensor die 110 has a protective layer 117 of a predetermined thickness formed on the first surface 111, except for the sensing portion 114 and the first bonding pads 116, and the first sealing pad 115 may be formed on the protective layer 117.

Figure 7B:
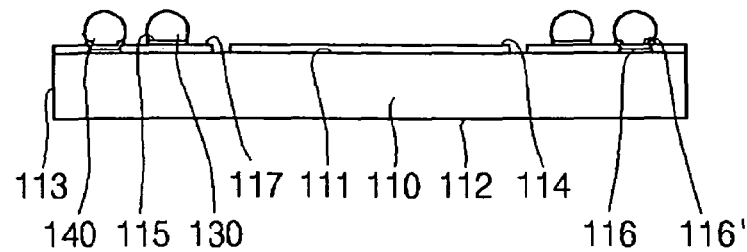

As shown in FIG. 7B, in the forming a sealing portion 130 and electrically conductive bumps 140, a sealing portion 130 is formed on the first sealing pad 115 and electrically conductive bumps 140 are formed on the first bonding pads 116. The sealing portion 130 and the electrically conductive bumps 140 may be formed of solder or its equivalent, but the material is not limited herein. The sealing portion 130 and the electrically conductive bumps 140 may be formed by printing solder only on the first sealing pad 115 and the first bonding pads 116 and then causing it to reflow, or by plating solder.

Figure 7C:
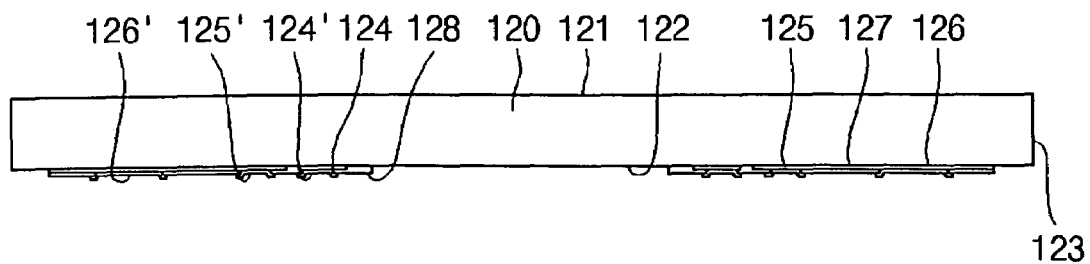

As shown in FIG. 7C, in the preparing a glass substrate 120, a glass substrate 120, which includes a second sealing pad 124 of an approximately square ring shape when viewed from above, a number of second bonding pads 125 formed outside of the second sealing pad 124, and a number of ball pads 126 formed outside of the second bonding pads 125, is prepared. The glass substrate 120 has an approximately planar first surface 121 and an approximately planar second surface 122, which is opposite to the first surface 121, and the second sealing pad 124, the second bonding pads 125, and the ball pads 126 are formed on the second surface 122. The glass substrate 120 has third surfaces 123 formed on the lateral ends of the first and second surfaces 121 and 122. The second sealing pad 124 and the second bonding pads 125 are formed in locations corresponding to those of the first sealing pad 115 and the first bonding pads 116, respectively, which are formed on the image sensor die 110. The ball pads 126 are formed in locations corresponding to that of the outer portion of the image sensor die 110, so that the solder balls 150 do not contact the image sensor die 110 at a later time. The second sealing pad 124, the second bonding pads 125, and the ball pads 126 may be formed of copper or its equivalent. The second sealing pad 124 may be electrically separated from the second bonding pads 125 and the ball pads 126, while the second bonding pads 125 and the ball pads 126 may be connected to each other via electrically conductive patterns 127. The second surface 122 may have a protective layer 128 of a predetermined thickness formed thereon, except for the second sealing pad 124, the second bonding pads 125, and the ball pads 126, but no protective layer 128 is formed in a region corresponding to the sensing portion 114 of the image sensor die 110 so that light can be easily transmitted to the sensing portion 114. The second sealing pad 124, the second bonding pads 125, and the ball pads 126 may additionally have UBM 124', 125', and 126', or an equivalent thereof for good connection with a sealing portion 130, electrically conductive bumps 140, and solder balls 150 (described below), respectively, but this does not limit the present invention.

Figure 7D:
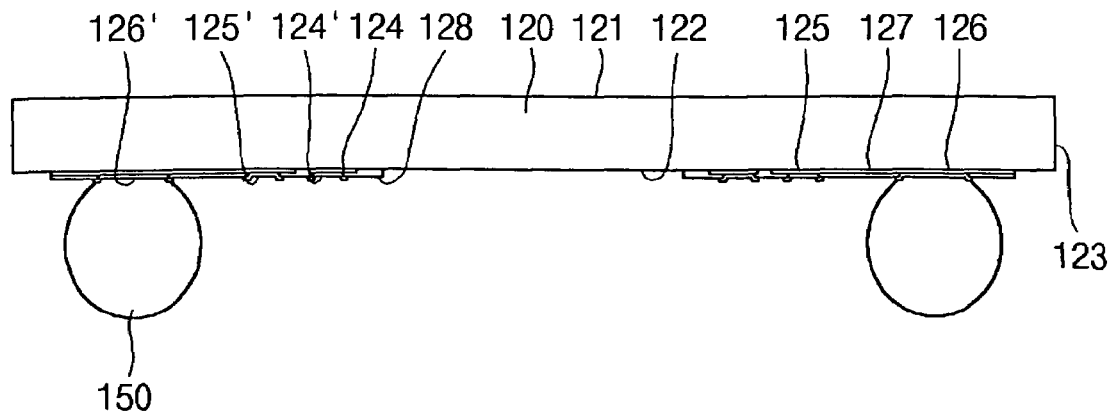

As shown in FIG. 7D, in the fusing solder balls 150, solder balls 150 of predetermined diameter are fused on respective ball pads 126 formed on the glass substrate 120. The height (or diameter) of the solder balls 150 is set to be larger than that of the image sensor die 110, so that the solder balls 150 can be easily mounted on an external apparatus at a later time without any hindrance from the image sensor die 110.

Figure 7E:
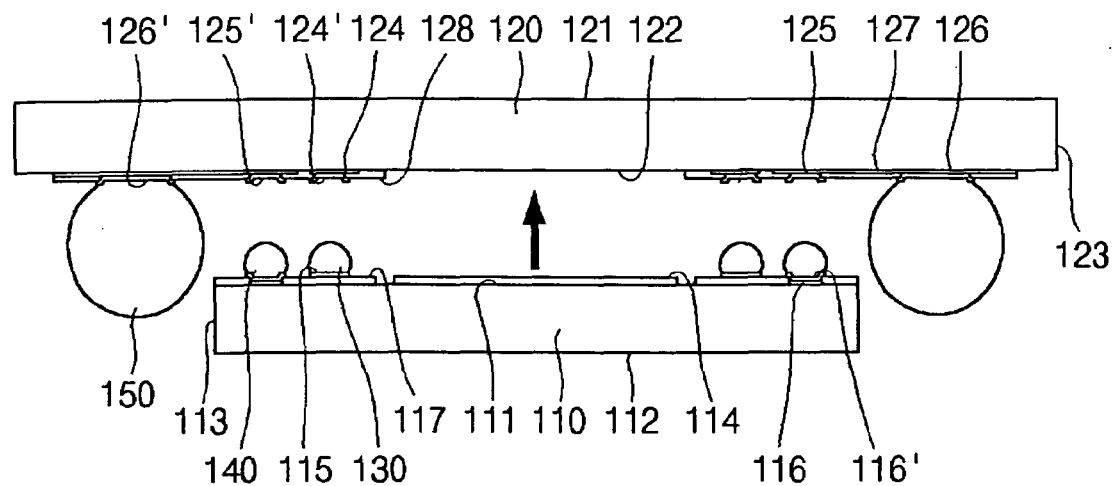

As shown in FIG. 7E, in the electrically connecting the image sensor die 110 to the glass substrate 120, the sealing portion 130 formed on the image sensor die 110 is connected to the second sealing pad 124 of the glass substrate 120, and the electrically conductive bumps 140 formed on the image sensor die 110 are connected to the second bonding pads 125 of the glass substrate 120. Particularly, a reflow process is performed while the sealing portion 130 is positioned corresponding to the second sealing pad 124 and the electrically conductive bumps 140 are positioned corresponding to the second bonding pads 125, so that the image sensor die 110 and the glass substrate 120 are connected to each other electrically and mechanically.

In the image sensor package manufactured by the method of the present invention, as mentioned above, the sensing portion 114 of the image sensor die 110 is completely sealed and separated from the exterior by the sealing portion 130. Accordingly, no external alien substance can penetrate into the sensing portion 114. The sealing portion 130 has excellent resistance to moisture and can completely prevent any moisture from penetrating into the sensing portion 114. The sealing portion 130 also plays the role of mechanically coupling the image sensor die 110 to the glass substrate 120. As a result, the strength of mechanical coupling between the image sensor die 110 and the glass substrate 120 is increased.

Referring to FIG. 8A to FIG. 8F, a method for manufacturing an image sensor package according to another embodiment of the present invention is shown in series.

As shown, the method for manufacturing an image sensor package according to the present invention includes: preparing an image sensor die 510 including a number of first bonding pads 516; forming electrically conductive bumps 540 on the first bonding pads 516; preparing a glass substrate 520 including a number of second bonding pads 525 and a number of ball pads 526; fusing solder balls 550 on respective ball pads 526; connecting the image sensor die 510 to the glass substrate 520; and gluing a cap 560 on the glass substrate 520.

Figure 8A:
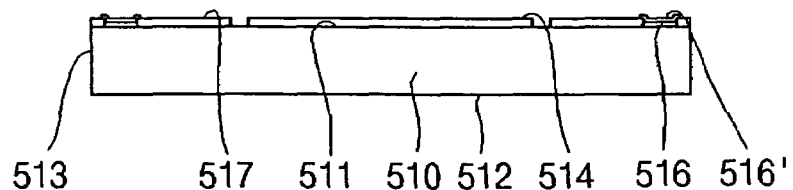
FIG. 8A to FIG. 8F show a method for manufacturing an image sensor package according to another embodiment of the present invention.

As shown in FIG. 8A, in the preparing an image sensor die 510, an image sensor die 510 including a number of first bonding pads 516 is prepared. The image sensor die 510 has an approximately planar first surface 511 and an approximately planar second surface 512, which is opposite to the first surface 511, and the first bonding pads 516 are formed on the first surface 511. The first surface 511 has a sensing portion 514 formed approximately in the center thereof for sensing external images and converting them into electric signals, and the first bonding pads 516 are formed outside of the sensing portion 514. The image sensor die 510 has third surfaces 513 formed on the lateral ends of the first and second surfaces 511 and 512. The first bonding pads 516 may additionally have UBM or its equivalent formed on the upper surfaces thereof, but the material does not limit the present invention. The image sensor die 510 has a protective layer 517 of a predetermined thickness formed on the first surface 511, except for the sensing portion 514 and the first bonding pads 516.

Figure 8B:
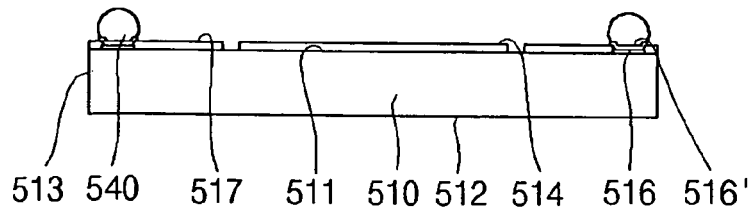

As shown in FIG. 8B, in the forming electrically conductive bumps 540, electrically conductive bumps 540 are formed on the first bonding pads 516. The electrically conductive bumps 540 may be formed of solder or its equivalent, but the material is not limited herein. The electrically conductive bumps 540 can be formed by printing solder only on the first bonding pads 516 and then causing it to reflow, or by plating solder.

Figure 8C:
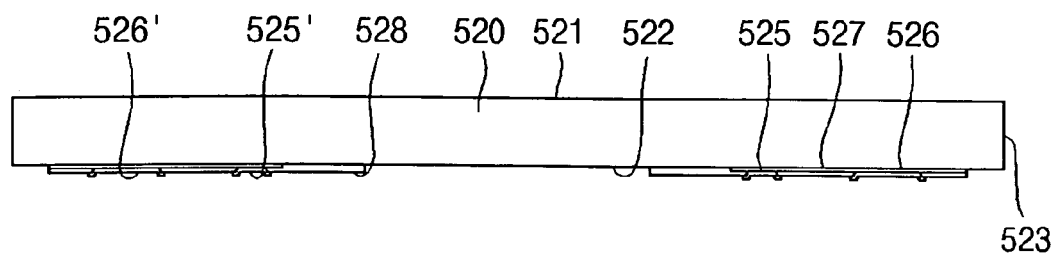

As shown in FIG. 8C, in the preparing a glass substrate 520, a glass substrate 520, which includes a number of second bonding pads 525 and a number of ball pads 526 formed outside of the second bonding pads 525, is provided. The glass substrate 520 has an approximately planar first surface 521 and an approximately planar second surface 522, which is opposite to the first surface 521, and the second bonding pads 525 and the ball pads 526 are formed on the second surface 522. The glass substrate 520 has third surfaces 523 formed on the lateral ends of the first and second surfaces 521 and 522. The second bonding pads 525 are formed in locations corresponding to those of the first bonding pads 516, which are formed on the image sensor die 510. Of course, the ball pads 526 are formed in locations corresponding to that of the outer portion of the image sensor die 510, so that the solder balls 550 do not contact the image sensor die 510 at a later time. The second bonding pads 525 and the ball pads 526 may be formed of copper or its equivalent. The second bonding pads 525 and the ball pads 526 may be connected to each other via electrically conductive patterns 527. The second surface 522 may have a protective layer 528 of a predetermined thickness formed thereon, except for the second bonding pads 525 and the ball pads 526, but no protective layer 528 is formed in a region corresponding to the sensing portion 514 of the image sensor die 510 so that light can be easily transmitted to the sensing portion 514. The second bonding pads 525 and the ball pads 526 may have UBM 525' and 526' or its equivalent formed thereon for good connection with electrically conductive bumps 540 and solder balls 550 (described below), respectively, but this does not limit the present invention.

Figure 8D:
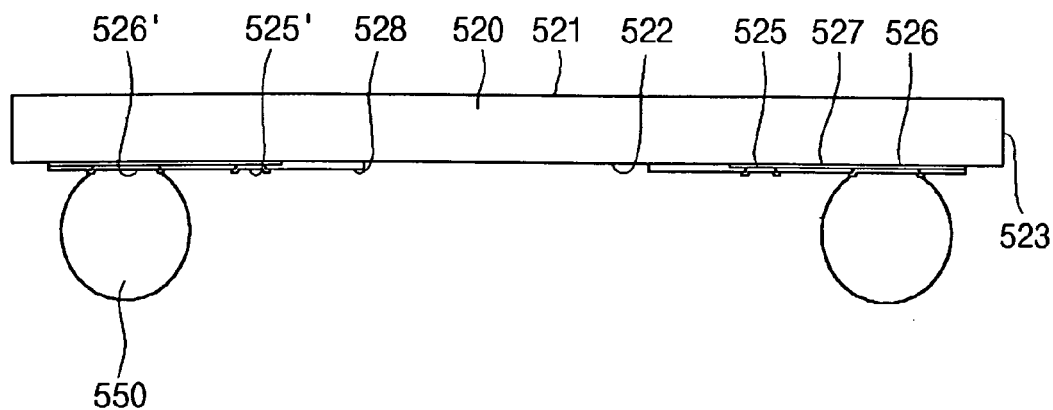

As shown in FIG. 8D, in the fusing solder balls 550, solder balls 550 of a predetermined diameter are fused on respective ball pads 526 formed on the glass substrate 520. The height (or diameter) of the solder balls 550 is set to be larger than that of the cap 560 (described below), so that the cap 560 does not interfere when the solder balls 550 are mounted on an external apparatus at a later time.

Figure 8E:
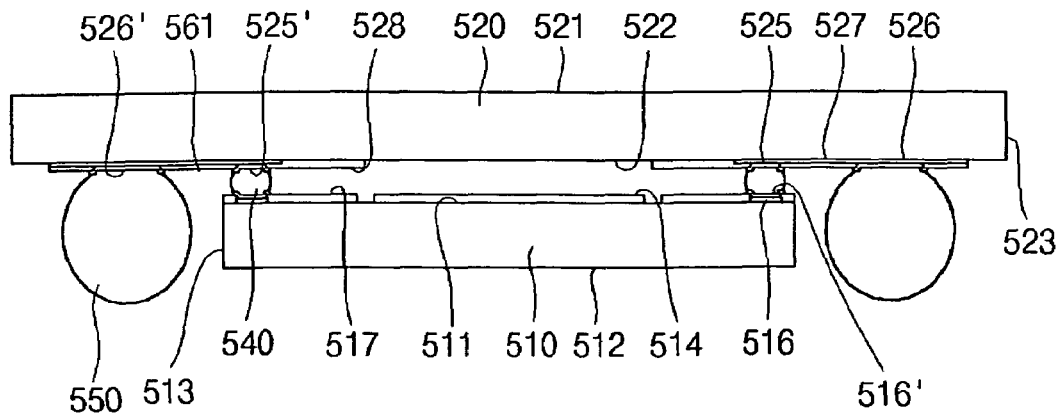

As shown in FIG. 8E, in the electrically connecting the image sensor die 510 to the glass substrate 520, the electrically conductive bumps 540 formed on the image sensor die 510 are connected to the second bonding pads 525 of the glass substrate 520. Particularly, a reflow process is performed while the electrically conductive bumps 540 are positioned corresponding to the second bonding pads 525, so that the image sensor die 510 and the glass substrate 520 are connected to each other electrically and mechanically.

Figure 8F:
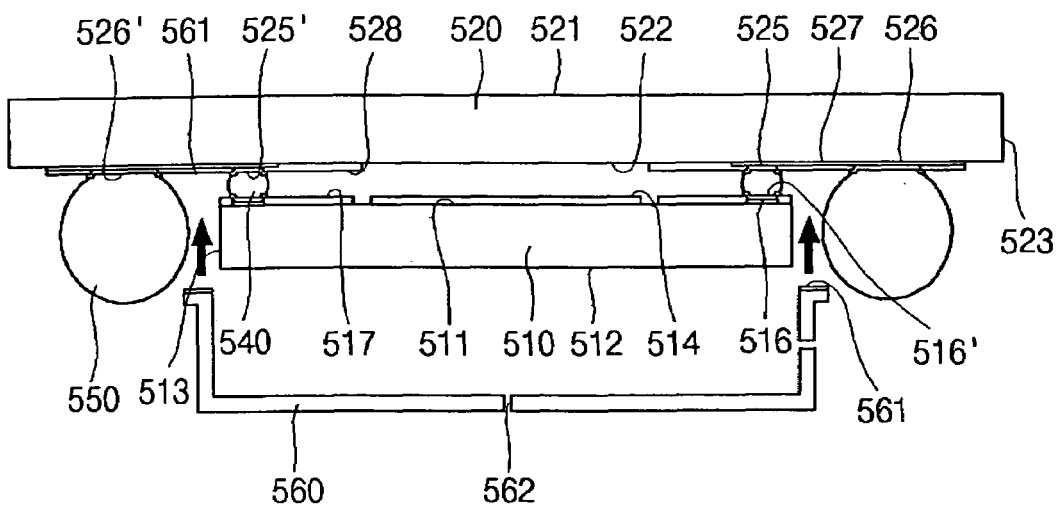

As shown in FIG. 8F, in the gluing a cap 560, a cap 560 is glued on the glass substrate 520, which is the outer peripheral edge of the image sensor die 510, with an adhesive 561 interposed between them.

In the image sensor package manufactured by the method of the present invention, as mentioned above, the image sensor die 510 is completely sealed and isolated from the exterior by the cap 560. Accordingly, no external alien substance can penetrate into the sensing portion 514 of the image sensor die 510. The cap 560 has excellent resistance to moisture and can completely prevent any moisture from penetrating into the sensing portion 514. The cap 560 may have at least one air vent 562 formed thereon, which plays the role of protecting the sensing portion 514 during a process wherein the image sensor package is provided with heat. Without the air vent 562, the sensing portion 514 would be completely isolated from the exterior and the internal pressure would increase during the process through which heat is provided. The surface of the sensing portion 514, when subject to such high pressure, would be easily fractured. However, the existence of the air vent 562 prevents the sensing portion 514 from being fractured, because the internal pressure does not increase even during the process through which heat is provided.

Referring to FIG. 9A to FIG. 9F, a method for manufacturing an image sensor package according to another embodiment of the present invention is shown in series.

As shown, the method for manufacturing an image sensor package according to the present invention includes: preparing an image sensor die 610 including a number of first bonding pads 615 and a first sealing pad 616; forming electrically conductive bumps 630 on the first bonding pads 615 and a sealing portion 640 on the first sealing pad 616, respectively; preparing a glass substrate 620 including a number of second bonding pads 624, a second sealing pad 625, and a number of ball pads 626; fusing solder balls 650 on respective ball pads 626; connecting the image sensor die 610 to the glass substrate 620; and filling an air vent 631, which is formed between the image sensor die 610 and the glass substrate 620, with a resin 632.

Figure 9A:
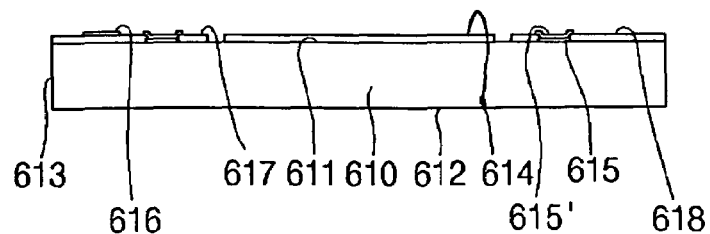
FIG. 9A to FIG. 9F show a method for manufacturing an image sensor package according to another embodiment of the present invention.

As shown in FIG. 9A, in the preparing an image sensor die 610, an image sensor die 610, which includes a number of first bonding pads 615 and a first sealing pad 616 of an approximately square ring shape when viewed from above, is prepared. The image sensor die 610 has an approximately planar first surface 611 and an approximately planar second surface 612, which is opposite to the first surface 611, and the first bonding pads 615 and the first sealing pad 616 are formed on the first surface 611. The first surface 611 has a sensing portion 614 formed approximately in the center thereof for sensing external images and converting them into electric signals. The image sensor die 610 has third surfaces 613 formed on the lateral edges of the first and second surfaces 611 and 612. The first bonding pads 615 may have UBM 615' or its equivalent formed on the upper surfaces thereof, and the first sealing pad 616 may be formed of copper, UBM, or an equivalent thereof, but the material does not limit the present invention. The image sensor die 610 has a protective layer 617 of a predetermined thickness formed on the first surface 611, except for the sensing portion 614 and the first bonding pads 615, and the first sealing pad 616 may be formed on the protective layer 617. The first sealing pad 616 may have at least air vent incision 618 formed in a predetermined region. For example, the air vent incision 618 may be formed on an approximately square corner of the first sealing pad 616, but the location does not limit the present invention.

Figure 9B:
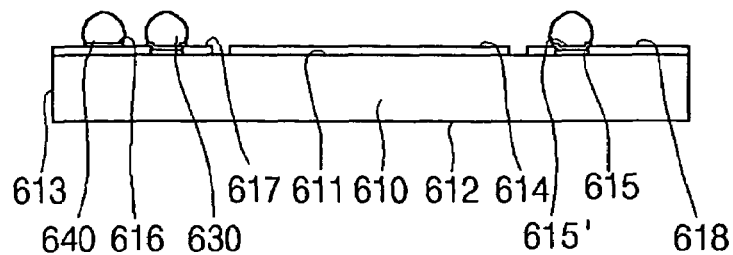

As shown in FIG. 9B, in the forming electrically conductive bumps 630 and a sealing portion 640, electrically conductive bumps 630 are formed on the first bonding pads 615 and a sealing portion 640 is formed on the first sealing pad 616. The electrically conductive bumps 630 and the sealing portion 640 may be formed of solder or its equivalent, but the material is not limited herein. The electrically conductive bumps 630 and the sealing portion 640 may also be formed by printing solder only on the first bonding pads 615 and the first sealing pad 616 and then causing it to reflow, or by plating solder.

Figure 9C:
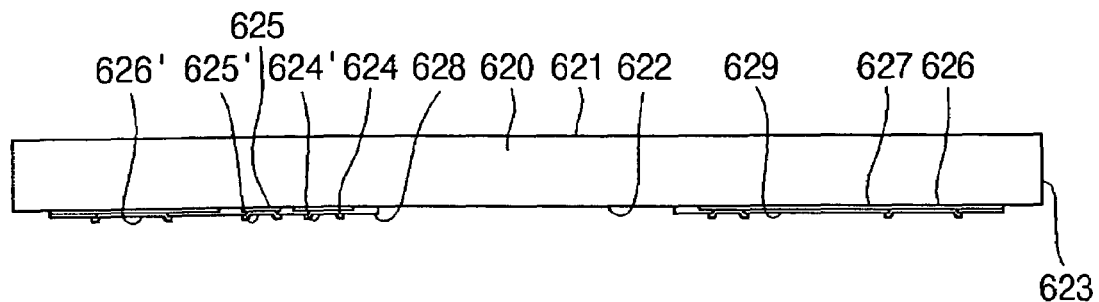

As shown in FIG. 9C, in the preparing a glass substrate 620, a glass substrate 620, which includes a number of second bonding pads 624, a second sealing pad 625 formed on the outer peripheral edges of the second bonding pads 624 in an approximately square ring shape when viewed from above, and a number of ball pads 626 formed outside of the second sealing pad 625, is provided. The glass substrate 620 has an approximately planar first surface 621 and an approximately planar second surface 622, which is opposite to the first surface 621, and the second bonding pads 624, the second sealing pad 625, and the ball pads 626 are formed on the second surface 622. The glass substrate 620 has third surfaces 623 formed on the lateral ends of the first and second surfaces 621 and 622. The second bonding pads 624 and the second sealing pad 625 are formed in locations corresponding to those of the first bonding pads 615 and the first sealing pad 616, respectively, which are formed on the image sensor die 610. The ball pads 626 are formed in locations corresponding to that of the outer portion of the image sensor die 610, so that the solder balls 650 do not contact the image sensor die 610 at a later time. The second bonding pads 624, the second sealing pad 625, and the ball pads 626 may be formed of copper or its equivalent. The second sealing pad 625 may be electrically separated from the second bonding pads 624 and the ball pads 626, while the second bonding pads 624 and the ball pads 626 may be connected to each other via electrically conductive patterns 627. The second surface 622 may have a protective layer 628 of a predetermined thickness formed thereon, except for the second bonding pads 624, the second sealing pad 625, and the ball pads 626, but no protective layer 628 is formed in a region corresponding to the sensing portion 614 of the image sensor die 610 so that light can be easily transmitted to the sensing portion 614. The second bonding pads 624, the second sealing pad 625, and the ball pads 626 may additionally have UBM 624', 625', and 626' or its equivalent formed thereon for good connection with electrically conductive bumps 630, a sealing portion 640, and solder balls 650 (described below), respectively, but this does not limit the present invention.

The second sealing pad 625 has at least one air vent incision 629 formed in a predetermined region. For example, the air vent incision 629 may be formed on an approximately square corner of the second sealing pad 625, but the location does not limit the present invention.

Figure 9D:
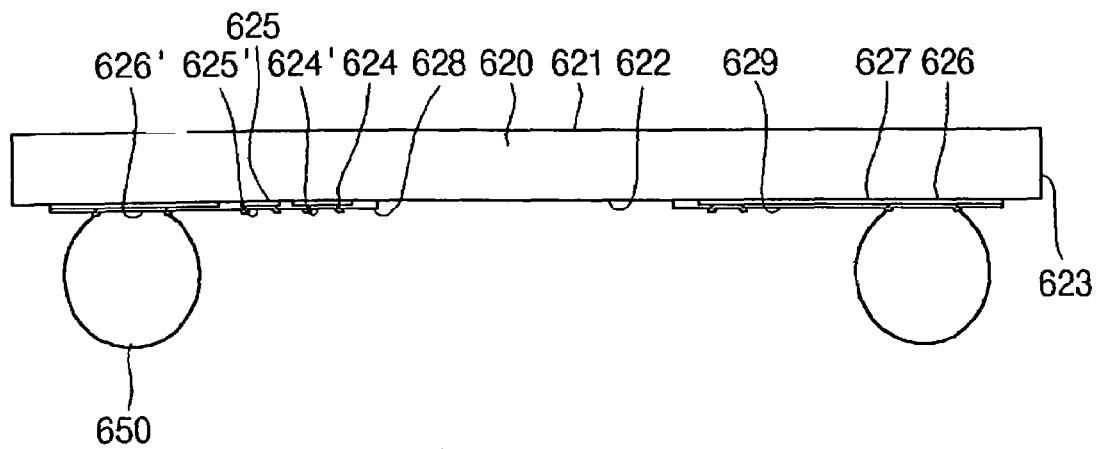

As shown in FIG. 9D, in the fusing solder balls 650, solder balls 650 of a predetermined diameter are fused on respective ball pads 626 formed on the glass substrate 620. The height (or diameter) of the solder balls 650 is set to be larger than that of the image sensor die 610 so that the solder balls 650 can be easily mounted on an external apparatus at a later time without any hindrance from the image sensor die 610.

Figure 9E:
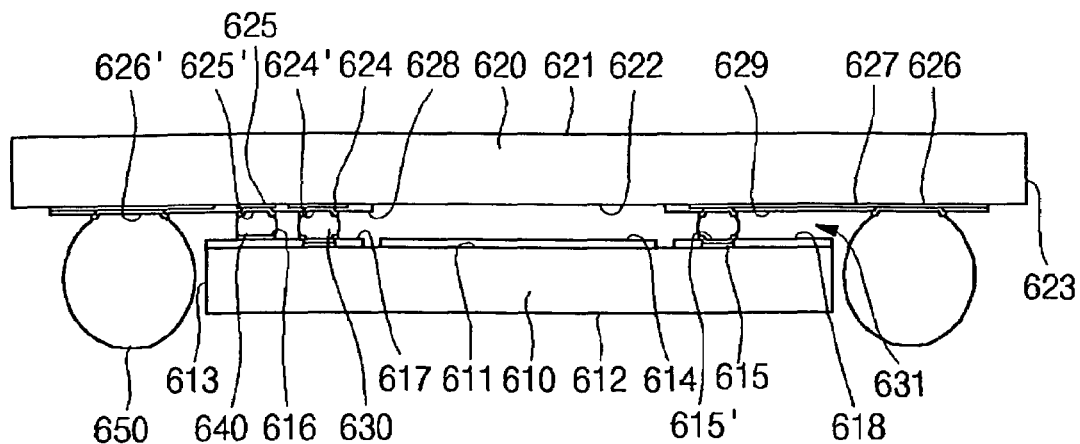

As shown in FIG. 9E, in the electrically connecting the image sensor die 610 to the glass substrate 620, the electrically conductive bumps 630 formed on the image sensor die 610 are connected to the second bonding pads 624 of the glass substrate 620, and the sealing portion 640 formed on the image sensor die 610 is connected to the second sealing pad 625 of the glass substrate 620. Particularly, a reflow process is performed while the electrically conductive bumps 630 are positioned corresponding to the second bonding pads 624 and the sealing portion 640 is positioned corresponding to the second sealing pad 625, so that the image sensor die 610 and the glass substrate 620 can be connected to each other electrically and mechanically.

Meanwhile, no conductor is formed on the air vent incision 618 of the image sensor die 610 and on the air vent incision 629 of the glass substrate 620, and an air vent 631 is naturally formed on the sealing portion 640. The air vent 631 plays the role of protecting the sensing portion 614 while the electrically conductive bumps 630 are connected to the second bonding pads 624 of the glass substrate 620. Without the air vent 631, the sensing portion 614 would be completely isolated from the exterior and the internal pressure would increase during such a process through which heat is provided. The surface of the sensing portion 614, when subject to such high pressure, would be easily fractured. However, the existence of the air vent 631 prevents the sensing portion 614 from being fractured, because the internal pressure does not increase even during the process through which heat is provided.

Figure 9F:
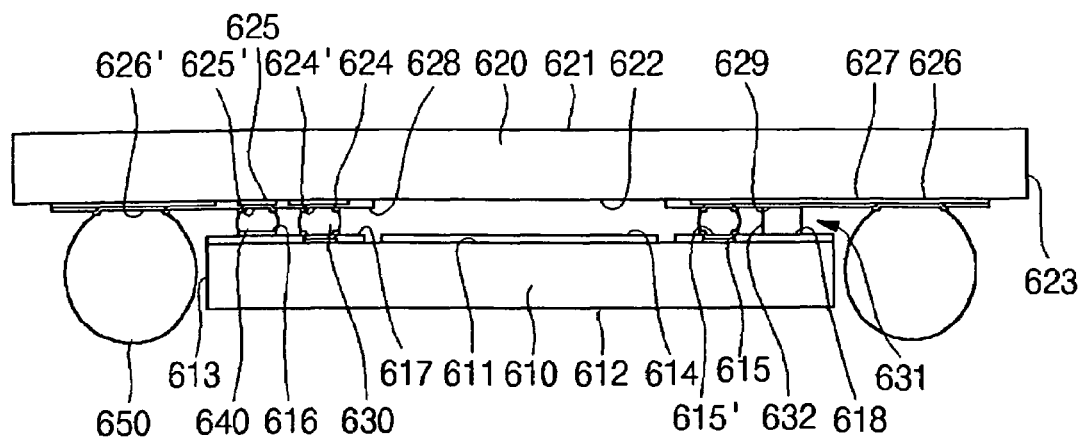

As shown in FIG. 9F, in the resin filling, an air vent 631, which is formed between the image sensor die 610 and the glass substrate 620, is filed with a resin 632. In other words, an air vent 631 formed on the sealing portion 640 is filled with a resin 632, so that the sensing portion 614 and the electrically conductive bumps 630 are completely sealed and isolated from external environment. The resin 632 may be silicone or its equivalent, but the material is not limited herein.

Accordingly, no external alien substance can penetrate into the sensing portion 614 and the electrically conductive bumps 630. The sealing portion 640 has excellent resistance to moisture and can prevent any moisture from penetrating into the sensing portion 614 and the electrically conductive bumps 630. The sealing portion 640 also plays the role of mechanically coupling the image sensor die 610 to the glass substrate 620, and the strength of mechanical coupling between the image sensor die 610 and the glass substrate 620 is increased accordingly. The sealing portion 640 makes it unnecessary to form an underfill on the electrically conductive bumps 630. Since no underfill is formed, any contamination of the sensing portion 614 by the underfill can be avoided.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. An image sensor package comprising:
an image sensor die having an approximately planar first surface, an approximately planar second surface which is opposite to the first surface, a sensing portion formed in the center of the first surface for sensing external images, a first sealing pad formed on the outer peripheral edge of the sensing portion, and a number of first bonding pads formed on the outer peripheral edge of the first sealing pad;
a glass substrate having an approximately planar first surface, an approximately planar second surface which is opposite to the first surface of the glass substrate, a second sealing pad formed on the second surface of the glass substrate, a number of second bonding pads formed on the outer peripheral edge of the second sealing pad, and a number of ball pads formed on the outer peripheral edges of the second bonding pads;
a sealing portion connecting the first sealing pad of the image sensor die and the second sealing pad of the glass substrate to each other;
electrically conductive bumps connecting the first bonding pads of the image sensor die and the second bonding pads of the glass substrate to each other; and
a number of solder balls fused on the ball pads of the glass substrate.

2. An image sensor package as claimed in claim 1, wherein the first sealing pad has the shape of an approximately square ring when viewed from above.

3. An image sensor package as claimed in claim 1, wherein the image sensor die has a protective layer formed on the first surface of the image sensor die, and the first sealing pad is formed on the protective layer.

4. An image sensor package as claimed in claim 1, wherein the sealing portion is formed of solder.

5. An image sensor package as claimed in claim 1, wherein the second sealing pad is formed of copper.

6. An image sensor package as claimed in claim 1, wherein the second sealing pad is electrically separated from the second bonding pads, and the second bonding pads are electrically connected to the ball pads by electrically conductive patterns.

7. An image sensor package as claimed in claim 1, wherein the solder balls are formed on the outer peripheral edge of the image sensor die.

8. An image sensor package as claimed in claim 1, wherein the electrically conductive bumps are surrounded by an underfill.

9. An image sensor package as claimed in claim 1, wherein the first sealing pad and the second sealing pad have at least one air vent incision formed in locations corresponding to each other.

10. An image sensor package as claimed in claim 1, wherein the sealing portion has at least one air vent formed thereon.

11. An image sensor package comprising:
an image sensor die having an approximately planar first surface, an approximately planar second surface which is opposite to the first surface, a sensing portion formed in the center of the first surface for sensing external images, and a number of first bonding pads formed on the outer peripheral edge of the sensing portion;
a glass substrate having an approximately planar first surface, an approximately planar second surface which is opposite to the first surface of the glass substrate, a number of second bonding pads formed on the second surface, and a number of ball pads formed on the outer peripheral edges of the second bonding pads;

electrically conductive bumps connecting the first bonding pads of the image sensor die and the second bonding pads of the glass substrate to each other;

a number of solder balls fused on the ball pads of the glass substrate; and a cap glued on the glass substrate with an adhesive, the cap covering the image sensor die.

12. An image sensor package as claimed in claim 11, wherein the solder balls are formed on the outer peripheral edge of the cap.

13. An image sensor package as claimed in claim 11, wherein the height of the solder balls is larger than that of the cap.

14. An image sensor package as claimed in claim 11, wherein the cap has at least one air vent formed thereon.

15. An image sensor package comprising:

an image sensor die having an approximately planar first surface, an approximately planar second surface which is opposite to the first surface, a sensing portion formed in the center of the first surface for sensing external images, a number of first bonding pads formed on the outer peripheral edge of the sensing portion, and a first sealing pad formed on the outer peripheral edges of the first bonding pads;

a glass substrate having an approximately planar first surface, an approximately planar second surface which is opposite to the first surface, a number of second bonding pads formed on the second surface, a second sealing pad formed on the outer peripheral edges of the second bonding pads, and a number of ball pads formed on the outer peripheral edge of the second sealing pad;

electrically conductive bumps connecting the first bonding pads of the image sensor die and the second bonding pads of the glass substrate to each other;

a sealing portion connecting the first sealing pad of the image sensor die and the second sealing pad of the glass substrate to each other; and a number of solder balls fused on the ball pads of the glass substrate.

16. An image sensor package as claimed in claim 15, wherein the first sealing pad has the shape of an approximately square ring when viewed from above.

17. A method for manufacturing an image sensor package comprising:

preparing an image sensor die having an approximately planar first surface, an approximately planar second surface which is opposite to the first surface, a sensing portion formed in the center of the first surface for sensing external images, a first sealing pad formed on the outer peripheral edge of the sensing portion, and a number of first bonding pads formed on the outer peripheral edge of the first sealing pad;

forming a sealing portion on the first sealing pad and electrically conductive bumps on the first bonding pads, respectively;

preparing a glass substrate having an approximately planar first surface, an approximately planar second surface which is opposite to the first surface of the glass substrate, a second sealing pad formed on the second surface of the glass substrate, a number of second bonding pads formed on the outer peripheral edge of the second sealing pad, and a number of ball pads formed on the outer peripheral edges of the second bonding pads;

fusing solder balls on the ball pads; and connecting the sealing portion to the second sealing pad and the electrically conductive bumps to the second bonding pads, respectively.

18. A method for manufacturing an image sensor package as claimed in claim 17, wherein the forming a sealing portion and electrically conductive bumps is performed by printing solder and then causing the solder to reflow.

19. A method for manufacturing an image sensor package as claimed in claim 17, wherein the forming a sealing portion and electrically conductive bumps is performed by plating solder.

20. A method for manufacturing an image sensor package as claimed in claim 17, wherein the preparing a glass substrate further includes forming UBM on the lower surfaces of the second sealing pad, the first bonding pads, and the ball pads.

* * * * *